United States Patent
Wang et al.

(10) Patent No.: US 11,221,556 B2
(45) Date of Patent: Jan. 11, 2022

(54) METHOD FOR FABRICATING SPHERICAL CONCAVE MIRROR IN OPTICAL WAVEGUIDE BASED ON ULTRAVIOLET GRAYSCALE LITHOGRAPHY

(71) Applicant: Shanghai University, Shanghai (CN)

(72) Inventors: Tingyun Wang, Shanghai (CN); Chuanlu Deng, Shanghai (CN); Xueting Wang, Shanghai (CN); Yi Huang, Shanghai (CN); Xiaobei Zhang, Shanghai (CN)

(73) Assignee: SHANGHAI UNIVERSITY, Shanghai (CN)

( * ) Notice: Subject to any disclaimer, the term of this patent is extended or adjusted under 35 U.S.C. 154(b) by 0 days.

(21) Appl. No.: 17/014,714

(22) Filed: Sep. 8, 2020

(65) Prior Publication Data

US 2021/0072641 A1    Mar. 11, 2021

(30) Foreign Application Priority Data

Sep. 6, 2019  (CN) .......................... 201910843158.8

(51) Int. Cl.
| | |
|---|---|
| *G03F 7/20* | (2006.01) |
| *G03F 7/00* | (2006.01) |
| *G02B 6/13* | (2006.01) |
| *G03F 1/38* | (2012.01) |
| *G03F 7/16* | (2006.01) |
| *G02B 6/12* | (2006.01) |

(52) U.S. Cl.
CPC .............. *G03F 7/0005* (2013.01); *G02B 6/13* (2013.01); *G03F 1/38* (2013.01); *G03F 7/162* (2013.01); *G03F 7/2002* (2013.01); *G02B 2006/12173* (2013.01)

(58) Field of Classification Search
CPC . G03F 1/38; G03F 1/50; G03F 7/0005; G03F 7/2002; G02B 6/13; G02B 2006/12173
USPC ......................... 430/5, 321, 396; 385/14, 18
See application file for complete search history.

(56) References Cited

U.S. PATENT DOCUMENTS

| | | | | |
|---|---|---|---|---|
| 5,480,764 A | * | 1/1996 | Gal ..................... | G02B 6/12002 430/321 |
| 2005/0164131 A1 | * | 7/2005 | Yokouchi ........... | G02B 6/12002 430/321 |

FOREIGN PATENT DOCUMENTS

| | | | |
|---|---|---|---|
| CN | 1272182 A | | 11/2000 |
| CN | 1673829 A | * | 9/2005 |
| CN | 100474011 C | | 7/2007 |
| CN | 103395739 A | | 11/2013 |
| CN | 106707411 A | | 5/2017 |

OTHER PUBLICATIONS

Computer-generated translation of CN 1673829 (Sep. 2005). (Year: 2005).*

Erps, J. V., et al. Design and fabrication of embedded micro-mirror inserts for out-of-plane coupling in PCB-level optical interconnections. Micro-Optics. (2010).

* cited by examiner

*Primary Examiner* — John A McPherson
(74) *Attorney, Agent, or Firm* — Brian S. Boyer; Syndicated Law, PC

(57) ABSTRACT

Disclosed is a method for fabricating a spherical concave mirror in an optical waveguide based on ultraviolet (UV) grayscale lithography. A key component is a specially designed mask pattern composed of a rectangle as well as a semicircle adjacent to the rectangle, where a rectangular area has no grayscale distribution, and UV light penetrating through different portions of the rectangular area has the same intensity; a semicircular area has the grayscale distribution, and the UV light penetrating through the semicircular area with the grayscale distribution is changed in intensity from the center of a circle in the radius direction according to a special function distribution law; an interlayer photoresist in the rectangular area is irradiated by the UV light penetrating through a mask plate and is developed to form an optical waveguide core.

6 Claims, 3 Drawing Sheets

Substrate is cleaned

Cladding photoresist is spin-coated

Interlayer photoresist is spin-coated

Ultraviolet exposure is performed

Developing is performed

Cladding photoresist is spin-coated

Interlayer is spin-coated

Developing is performed after lithography

High-reflective film is coated

Upper cladding photoresist is spin-coated

Interlayer is spin-coated

Developing is performed after lithography

High-reflective film is coated

Upper cladding photoresist is spin-coated

METHOD FOR FABRICATING SPHERICAL CONCAVE MIRROR IN OPTICAL WAVEGUIDE BASED ON ULTRAVIOLET GRAYSCALE LITHOGRAPHY

CROSS REFERENCE TO RELATED APPLICATION

This application claims the priority benefit of Chinese Patent Application No. 201910843158.8, filed Sep. 6, 2019, which is hereby incorporated herein by reference in its entirety.

TECHNICAL FIELD

The present invention relates to a method for fabricating an optical waveguide, in particular to a method for fabricating a spherical concave mirror in an optical waveguide, which is used in the technical filed of interconnections of optical backplanes.

BACKGROUND

In recent years, an optical backplane interconnection technology has become a hotspot in researching the information interconnection of high-end devices. It will be widely used in the fields of wideband communication, supercomputers, big data centers, etc. by virtue of its big bandwidth, low energy consumption, low cost, and other advantages.

As one of key technologies in the fields of optical backplane interconnections, an efficient vertical coupling for optical fibers and optical waveguides has the advantages of full use of device space, high design flexibility, easy integration of photoelectric devices, and the like. The efficiency of vertical coupling between the optical fibers and the optical waveguides is mainly improved by means of convergence of concave mirrors, in this way, light beams can be converged to improve the match of numerical apertures (NA) between coupled devices, and the mode field diameter of incident light can be decreased to improve the match of mode field coupling. Up to now, many methods for fabricating concave mirrors are put forward, such as a chemical etching method (Patent Publication No.: CN 1272182A), a fabrication method based on non-invasive water molecules (Patent Publication No.: CN103395739A), an annular laser etching method (Patent Application No.: 201710076388.7), and a deep proton writing (DPW) method (document: Design and fabrication of embedded micro-mirror inserts for out-of-plane coupling in PCB level optical interconnections). However, the chemical etching method has low accuracy, complex processes, difficulty in controls over concave shapes, and the like; the fabrication method based on non-invasive water molecules, which obtains concave surfaces by means of compactness of materials with a liquid drop as a mold, has complex processes, low accuracy, difficulty in obtaining the concave surfaces in optical backplanes; the annular laser etching method as a laser "cold" processing method, which obtains concave mirrors by means of laser etching after optical backplanes are fabricated, has high roughness of the obtained concave surfaces and certain influence on transmission performance of optical waveguides and needs to lower the roughness by means of postprocessing; and the DPW method which processes concave mirrors when optical waveguides are fabricated has extremely complex processes, and difficulty in accuracy controls or mass production. As shown in FIG. 1(a) to FIG. 1(f) in FIG. 1, a common process for fabricating optical waveguides by means of UV lithography mainly includes: a substrate 1 is cleaned; a lower cladding photoresist 2 is spin-coated; an interlayer photoresist 3 is spin-coated; UV exposure 4 is performed by means of a mask plate 5; an optical waveguide core 6 is formed after developing; and an upper cladding photoresist 7 is spin-coated. Light penetrating through the mask plate 5 generally without grayscale distributions has the same intensity, and consequentially, the interlayer photoresist cannot form a concave structure. To obtain the concave structure, other supplementary means are needed, in this case, additional steps for fabricating concave mirrors are required, and the complexity of the process is increased. In view of this, it is urgent to provide a method which is simpler, more effective, feasible, and suitable for fabricating concave mirrors on a large scale.

SUMMARY

The objective of the present invention is to overcome the shortcomings of the prior art by providing a method for fabricating a spherical concave mirror in an optical waveguide based on ultraviolet (UV) Grayscale lithography, which significantly improves efficiency of vertical coupling between optical fibers and optical waveguides. The present invention has easy operation, desirable controllability, and optimal compatibility with an optical waveguide fabrication process.

To achieve the above objective, the present invention adopts the following concept:

A method for fabricating a spherical concave mirror in an optical waveguide based on UV grayscale lithography is mainly implemented by means of UV exposure performed by a lithography machine capable of generating a mask pattern. The mask pattern includes a semicircle with a grayscale distribution, and the grayscale distribution refers to that gray values in different areas of the mask pattern are changed in a stepped manner, so that light penetrating through different areas of the semicircle has different intensities. The lithography machine performs exposure according to the mask pattern, and the light penetrating through a semicircular area with the grayscale distribution is reduced in intensity from the center to the edge of a circle in the radial direction according to a change law of a decreasing function. Accordingly, an interlayer photoresist in the semicircular area is irradiated by the light having the intensity regularly distributed and is then developed to obtain a spherical concave surface.

The operating principle for directly fabricating a concave mirror in an optical waveguide through a semicircular mask pattern with a grayscale distribution is as follows:

The mask pattern actually includes a rectangle and a semicircle adjacent to the rectangle, where a rectangular area has no grayscale distribution, in this case, UV light penetrating through all portions of the rectangular area has the same intensity; and a semicircular area has the grayscale distribution, and the UV light penetrating through the semicircular area is reduced in intensity in the radius direction according to the change law of the decreasing function. When exposed under the UV light, the interlayer photoresist in the rectangular area is fully irradiated and is developed to form an optical waveguide core; only an upper portion of the interlayer photoresist in a partial semicircular area is fully irradiated according to a grayscale distribution law of the intensity of the UV light and is increased in thickness on the whole from the center to the edge of the circle in the radius direction according to the change law of the decreasing function, and the spherical concave surface is formed after developing. A grayscale distribution function is determined in a manner that the intensity of the UV light, which is required by lithography at all points, is determined by lithographic depths at all the points on the obtained spherical concave surface and has a rule that gray values are gradually decreased from the center to the edge of the circle in the radial direction. The obtained spherical concave surface is coated with a metal film or a dielectric high-reflective film, in this way, the spherical concave mirror is fabricated on the optical waveguide.

The technical solution adopted by the present invention according to the above concept is as follows:

A method for fabricating a spherical concave mirror in an optical waveguide based on UV grayscale lithography is mainly implemented by means of UV exposure through a lithography machine capable of generating a mask pattern. The mask pattern shows a semicircular mask with a grayscale distribution, and the grayscale distribution refers to that gray values in different areas of the mask pattern are stepped, so that light penetrating through different areas of the semicircular mask has different intensities and is finally gradually decreased in intensity in the radial direction of the semicircular mask. The lithography machine performs exposure according to the mask pattern, and the light penetrating through the semicircular mask with the grayscale distribution is reduced in intensity from the center to the edge of a circle in the radial direction according to a change law of a decreasing function. In a process for fabricating the optical waveguide by means of UV lithography, an interlayer photoresist in the semicircular mask is irradiated by the light having the intensity changed according to the grayscale distribution and is then developed to obtain a spherical concave surface or convex surface; and afterwards, the obtained spherical concave surface or convex surface is coated with a metal film or a dielectric high-reflective film and then spin-coated with a cladding photoresist, in this way, a spherical concave mirror is fabricated on the optical waveguide. To obtain different intensities of the light penetrating through different areas of the semicircular mask, the grayscale distribution in the present invention adopts a rule that gray values of images are changed in a stepped manner in the radial direction of the semicircular mask.

Preferably, the mask pattern includes a rectangle and a semicircle, where a rectangular area of a mask has no grayscale distribution, in this case, UV light penetrating through all areas of the mask has the same intensity; and a semicircular area having a radius longer than the width of the rectangular area has the grayscale distribution, and the UV light penetrating through the mask is reduced in intensity from the center to the edge of the circle in the radius direction of the semicircular area according to the change law of the decreasing function. The semicircular area having the radius longer than the width of the rectangular area has the grayscale distribution, and the UV light penetrating through the mask is regulated in intensity in the radius direction of the semicircular area according to the change law of the decreasing function.

Preferably, the rectangular area of the mask is completely opaque or completely transparent.

Preferably, if a spherical concave structure is fabricated on the optical waveguide by means of a positive interlayer photoresist, when the mask is exposed under the UV light, the interlayer photoresist in the rectangular area is fully irradiated; after being developed, the interlayer photoresist irradiated by the UV light is removed, and the interlayer photoresist unirradiated by the UV light is retained, so that an optical waveguide core is formed; and the interlayer photoresist in a partial semicircular area has an upper half fully irradiated according to a grayscale distribution law of the intensity of the UV light and increased in thickness from the center to the edge of the circle in the radius direction of the semicircular area according to a change law of an increasing function as well as an incompletely irradiated lower half retained after being developed, so that the concave surface is formed on a corresponding interlayer in the semicircular area of the mask. Afterwards, the obtained spherical concave surface is coated with the metal film or the dielectric high-reflective film and then spin-coated with the cladding photoresist, in this way, the spherical concave mirror is fabricated on the optical waveguide.

Preferably, if the spherical concave structure is fabricated on the optical waveguide by means of a negative interlayer photoresist, when the mask is exposed under the UV light, the negative interlayer photoresist in the rectangular area is fully irradiated; after being developed, the negative interlayer photoresist unirradiated by the UV light is removed, the negative interlayer photoresist irradiated by the UV light is retained, so that an optical waveguide core is formed; and an upper half of the negative interlayer photoresist in the partial semicircular area is fully irradiated according to the grayscale distribution law of the intensity of the UV light and is decreased in thickness in the radius direction of the semicircular area according to the change law of the decreasing function, and only the fully irradiated upper half of the negative interlayer photoresist is retained after being developed, so that a convex surface is formed on the corresponding interlayer in the semicircular area of the mask, and a concave surface is formed opposite the convex surface in the interlayer. Afterwards, the obtained spherical concave surface is coated with the metal film or the dielectric high-reflective film and then spin-coated with the cladding photoresist, in this way, the spherical concave mirror is fabricated on the optical waveguide.

Preferably, a grayscale distribution function of the corresponding light intensity in the semicircular area of the mask is controlled as follows:

at the same lithographic period, the intensity of the UV light, which is required by lithography at all points, is determined by lithographic depths at all the points on the obtained spherical concave surface to determine the grayscale distribution function of the light intensity in the semicircular area of the mask; and due to circular symmetry of the spherical concave surface, the grayscale distribution function of the light intensity in the semicircular area of the mask has a rule that gray values are gradually decreased from the center to the edge of the circle in the radius direction.

Compared with the prior art, the present invention has the following outstanding substantive features and significant advantages:

1. Due to technical limitations, most conventional methods for fabricating a concave mirror have complex processes, low accuracy, high roughness of concave surfaces, difficulty in transplanting, or low compatibility with an optical waveguide fabrication process. The method for fabricating a spherical concave mirror in an optical waveguide based on UV grayscale lithography of the present invention is mainly implemented by means of UV lithography through a semicircular mask pattern with the grayscale distribution, thus having simple process, high accuracy, low roughness of concave surfaces, compatibility with the process for fabricating the optical waveguide, and mass production.

2. The method of the present invention has the compatibility with the process for fabricating an optical waveguide and organically combines with a process for fabricating the concave surface during the UV exposure; and furthermore, the concave surface is mainly fabricated by means of a semicircular mask pattern with grayscale. Accordingly, the method of the present invention has good compatibility with a mature process for fabricating the optical waveguide by means of the UV lithography, low costs of device improvements, and easy implementations.

DETAILED DESCRIPTION

The above solution is further explained with reference to specific examples, and the preferred examples of the present invention are expounded as follows:

Example 1

Figure 1A:
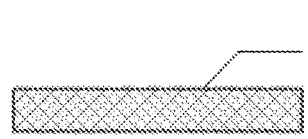
FIGS. 1(a)-1(f) is a structural diagram of a conventional process for fabricating an optical waveguide by means of lithography in the prior art.
Figure 1B:
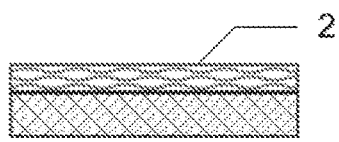
Figure 1C:
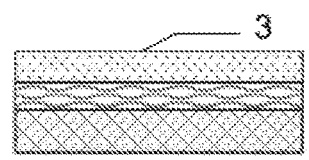
Figure 1D:
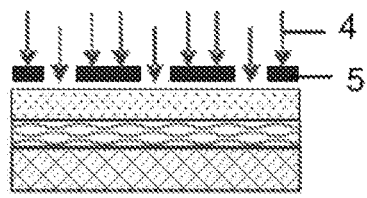
Figure 1E:
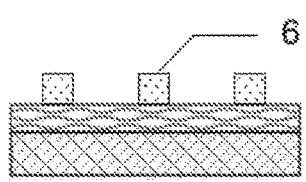
Figure 1F:
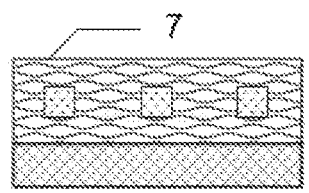
Figure 2:
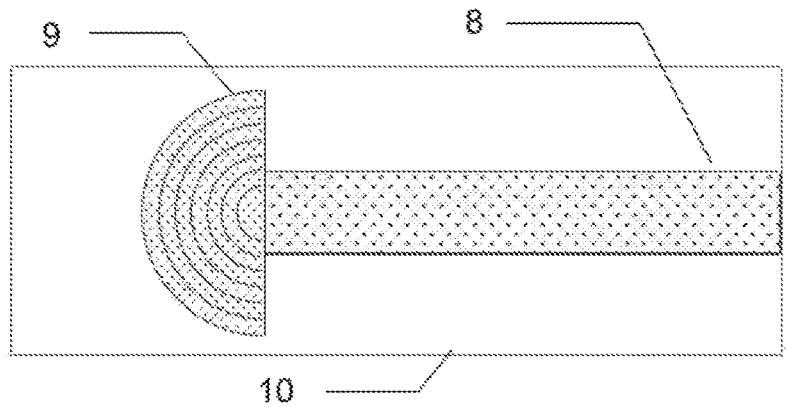
FIG. 2 is a semicircular mask pattern with a grayscale distribution for a positive interlayer photoresist in Example 1 of the present invention.
Figure 3A:
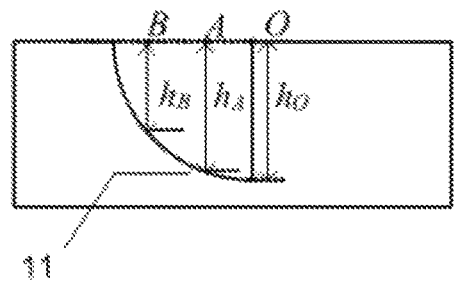
FIGS. 3(a)-3(b) is a structural diagram showing a relationship of a grayscale distribution function determined by a spherical concave surface fabricated from the positive interlayer photoresist in Example 1 of the present invention.
Figure 3B:
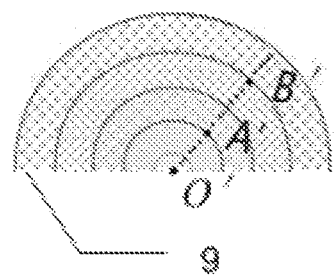
Figure 4A:
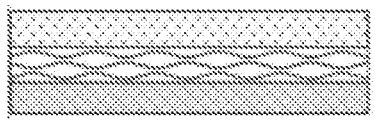
FIGS. 4(a)-4(d) is a structural diagram of a process, having compatibility with fabrication of an optical waveguide, for fabricating the spherical concave surface from the positive interlayer photoresist by means of lithography in Example 1 of the present invention.
Figure 4B:
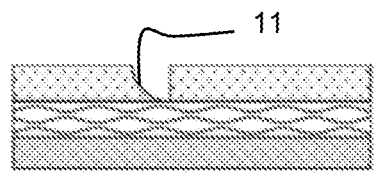
Figure 4C:
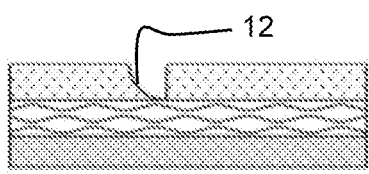
Figure 4D:
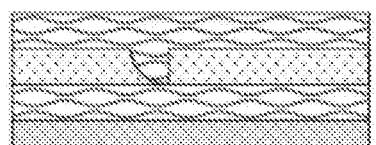

In this example, referring to FIG. 2 to FIG. 4, a method for fabricating a spherical concave mirror in an optical waveguide based on UV grayscale lithography is implemented by means of UV exposure performed by a lithography machine capable of generating a mask pattern. The mask pattern shows a semicircular mask with a grayscale distribution, and the grayscale distribution refers to that gray values in different areas of the mask pattern are changed in a stepped manner, so that light penetrating through different areas of the semicircular mask is gradually reduced in intensity from the center to the edge of a circle in the radial direction. The lithography machine performs exposure according to the mask pattern, and the light penetrating through the semicircular mask with the grayscale distribution is reduced in intensity in the radial direction according to a change law of a decreasing function. In a process for fabricating the optical waveguide by means of UV lithography, an interlayer photoresist in the semicircular mask is irradiated by the light having the intensity changed according to the grayscale distribution and is then developed to obtain a spherical concave surface; and afterwards, the obtained spherical concave surface is coated with a metal film or a dielectric high-reflective film and then spin-coated with a cladding photoresist, in this way, the spherical concave mirror is fabricated on the optical waveguide.

In this example, the mask pattern includes a rectangle 8 and a semicircle 9, where a completely opaque rectangular 8 area of a mask has no grayscale distribution showing a light intensity, in this case, UV light penetrating through all portions of the rectangular 8 area of the mask has the same intensity; and a semicircular 9 area having a radius longer than the width of the rectangular 8 area has the grayscale distribution showing the light intensity, in this case, the UV light penetrating through the semicircular 9 area of the mask is reduced in intensity in the radius direction according to the change law of the decreasing function.

In this example, referring to FIG. 2 to FIG. 4, if a spherical concave structure is fabricated on the optical waveguide by means of a positive interlayer photoresist, when the mask is exposed under the UV light, the interlayer photoresist in the rectangular 8 area is fully irradiated; after being developed, the interlayer photoresist irradiated by the UV light is removed, and the interlayer photoresist unirradiated by the UV light is retained, so that an optical waveguide core is formed; and the interlayer photoresist in a partial semicircular 9 area has an upper half fully irradiated according to a grayscale distribution law of the intensity of the UV light and increased in thickness in the radius direction of the semicircular 9 area according to a change law of an increasing function as well as an incompletely irradiated lower half retained after being developed, so that the concave surface is formed on a corresponding interlayer in the semicircular 9 area of the mask. Afterwards, the obtained spherical concave surface is coated with the metal film or the dielectric high-reflective film and then spin-coated with the cladding photoresist, in this way, the spherical concave mirror is fabricated on the optical waveguide.

In this example, referring to FIG. 2 to FIG. 4, a grayscale distribution function of the corresponding light intensity in the semicircular area of the mask is controlled as follows:

In this example, at the same lithographic period, the intensity of the UV light, which is required by lithography at all points, is determined by lithographic depths at all the points on the obtained spherical concave surface to determine the grayscale distribution function of the light intensity in the semicircular area of the mask; and due to circular symmetry of the spherical concave surface, the grayscale distribution function of the light intensity in the semicircular area of the mask has a rule that gray values are gradually decreased from the center to the edge of the circle in the radius direction. According to the method for fabricating a spherical concave mirror in an optical waveguide based on UV grayscale lithography in this example, the obtained spherical concave surface is coated with the metal film or the dielectric high-reflective film to form the spherical concave mirror.

In this example, referring to FIG. 2, the specially designed mask pattern generated by the lithography machine includes the rectangle 8 without the grayscale distribution as well as the semicircle 9, adjacent to the rectangle 8, with the grayscale distribution function, where the rectangle 8 area is completely opaque, the semicircular 9 area has the grayscale distribution showing that the gray values are decreased from the center to the edge of the circle in the radius direction as well as light transmittance gradually reduced from the center to the edge of the circle in the radius direction, and other areas 10 of the mask pattern are completely transparent. Referring to FIG. 3, the grayscale distribution function is obtained as follows: a ¼ spherical concave surface 11 with a radius R is fabricated on the optical waveguide by only determining depths at points on a radial line due to the circular symmetry of all the points in the semicircular area. For example, lithographic depths at a point O regarded as the center of the circle, a point A, and a point B on the radial line of the spherical concave surface are respectively denoted by $h_O$, $h_A$, and $h_B$, where $h_O=R$; at a lithographic time t, a light intensity at the lithographic point O is denoted by $I_O$, that is, the point O is completely transparent, so that the lithographic depth $h_O$ and a gray value $G_0$ can be achieved; similarly, gray values $G_A$ and $G_B$ at the point A and the point B in the semicircular area can be achieved; and similarly, gray values at other points in the semicircular area can be achieved. Referring to FIG. 4(a) to FIG. 4(d) in FIG. 4, after being developed, the positive interlayer photoresist, irradiated by the UV light, in the rectangular 8 area is removed, and the positive interlayer photoresist, unirradiated by the UV light, in the rectangular 8 area is retained; and the positive interlayer photoresist in the semicircular 9 area is irradiated by the UV light with the grayscale distribution and then developed to form the spherical concave surface. The spherical concave surface is coated with the metal film or the dielectric high-reflective film to form the spherical concave mirror 12. The spherical concave mirror is fabricated on the optical waveguide after being spin-coated with an upper clad layer.

In this example, referring to FIG. 1, the method for fabricating a spherical concave mirror in an optical waveguide based on UV grayscale lithography aims to obtain a strictly regular spherical concave surface. Compared with a conventional method for fabricating a concave mirror, the method of the present invention has simple process, high accuracy, low roughness of the obtained concave surface, optimal compatibility with an optical waveguide fabrication process, mass production, and so on. As shown in FIG. 1, a conventional process for fabricating the optical waveguide by means of UV lithography in the prior art mainly includes: a substrate 1 is cleaned; a lower cladding photoresist 2 is spin-coated; an interlayer photoresist 3 is spin-coated; UV exposure 4 is performed by means of a mask plate 5; an optical waveguide core 6 is formed after developing; and an upper cladding photoresist 7 is spin-coated. The method in this example has the compatibility with the above process for fabricating the optical waveguide and organically combines with a process for fabricating the concave surface during the UV exposure. The concave surface is mainly fabricated by means of a semicircular mask pattern with grayscale.

Example 2

This example basically the same as Example 1 has the following special features:

In this example, if the spherical concave structure is fabricated on the optical waveguide by means of a negative interlayer photoresist, when the mask is exposed under the UV light, the negative interlayer photoresist in the rectangular area is fully irradiated; after being developed, the negative interlayer photoresist unirradiated by the UV light is removed, the negative interlayer photoresist irradiated by the UV light is retained, so that an optical waveguide core is formed; and an upper half of the negative interlayer photoresist in the partial semicircular area is fully irradiated according to the grayscale distribution law of the intensity of the UV light and is decreased in thickness in the radius direction of the semicircular area according to the change law of the decreasing function, and only the fully irradiated upper half of the negative interlayer photoresist is retained after being developed, so that a convex surface is formed on the corresponding interlayer in the semicircular area of the mask, and a concave surface is formed opposite the convex surface in the interlayer. Afterwards, the obtained spherical concave surface is coated with the metal film or the dielectric high-reflective film and then spin-coated with the cladding photoresist, in this way, the spherical concave mirror is fabricated on the optical waveguide.

Figure 5:
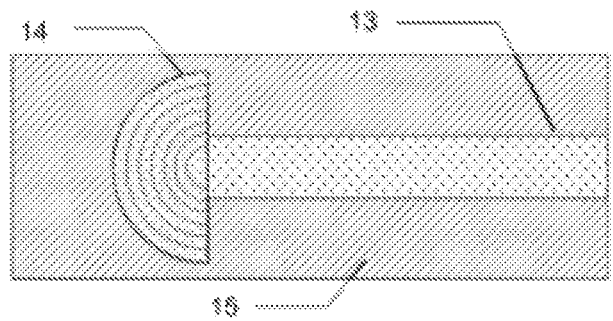
FIG. 5 is a semicircular mask pattern with a grayscale distribution for a negative interlayer photoresist in Example 1 of the present invention.
Figure 6A:
FIGS. 6(a)-6(d) is a structural diagram of a process, having compatibility with fabrication of an optical waveguide, for fabricating the spherical concave surface from the negative interlayer photoresist by means of lithography in Example 1 of the present invention.
Figure 6B:
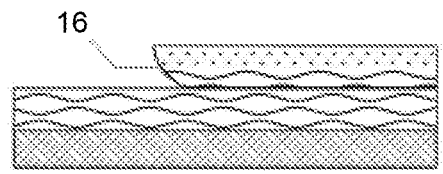
Figure 6C:
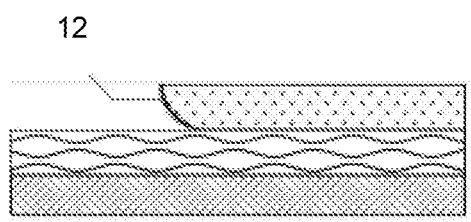
Figure 6D:
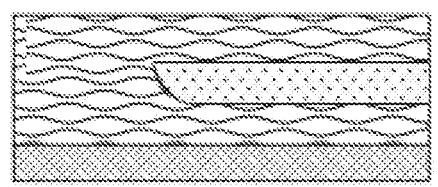

Referring to FIG. 5 and FIG. 6, in this example, the spherical concave mirror is fabricated on the optical waveguide by means of the negative interlayer photoresist. Referring to FIG. 5, a specially designed mask pattern generated by the lithography machine includes a rectangle 13 without the grayscale distribution as well as a semicircle 14, adjacent to the rectangle 13, with the grayscale distribution function, where a rectangle area is completely transparent, a semicircle area has the grayscale distribution showing that gray values are decreased from the center to the edge of the circle in the radius direction as well as light transmittance gradually reduced from the center to the edge of the circle in the radius direction; and other areas 15 of the mask pattern are completely opaque. The grayscale distribution function is obtained in the same way as that in Example 1. Referring to FIG 6(a) and FIG. 6(b), the negative interlayer photoresist is subjected to the UV exposure and then developed to form a spherical convex surface 16. The spherical convex surface is coated with the metal film or the dielectric high-reflective film to form the spherical concave mirror 12. The spherical concave mirror is fabricated on the optical waveguide after being spin-coated with the upper clad layer.

Referring to FIG. 5 and FIG. 6, according to the method for fabricating a spherical concave mirror in an optical waveguide based on UV grayscale lithography in this example, when the mask is exposed under the UV light, the negative interlayer photoresist in the rectangular 13 area without the grayscale distribution is fully irradiated; after being developed, the negative interlayer photoresist unirradiated by the UV light is removed, and the negative interlayer photoresist irradiated by the UV light is retained, so that the optical waveguide core is formed; and the upper part of the negative interlayer photoresist in the partial semicircular 14 area with the grayscale distribution function is fully irradiated according to the grayscale distribution law of the intensity of the UV light and is decreased in thickness in the radius direction according to the change law of the decreasing function, and only the irradiated upper half of the negative interlayer photoresist is retained after being developed, so that the convex surface is formed on the whole upper portion of the semicircular area. According to the method for fabricating a spherical concave mirror in an optical waveguide based on UV grayscale lithography in this example, the grayscale distribution function is accurately controlled as follows: at the same lithographic period, the intensity of the UV light, which is required by the lithography at all points, are determined by the lithographic depths at all the points on the obtained spherical concave surface to determine the grayscale distribution function in the circular area; and due to the circular symmetry of the spherical concave surface, the grayscale distribution function has the rule that the gray values are gradually decreased from the center to the edge of the circle in the radius direction; and moreover, the obtained spherical convex surface is coated with the metal film or the dielectric high-reflective film to form the spherical concave mirror.

Example 3

This example basically the same as Example 1 and Example 2 has the following special features:

In this example, the rectangular area of the mask is completely transparent if the spherical concave structure is fabricated on the optical waveguide by means of the positive interlayer photoresist, or the rectangular area of the mask is completely opaque if the spherical concave structure is fabricated on the optical waveguide by means of the negative interlayer photoresist, in any case, the spherical concave mirror can be fabricated on the optical waveguide.

In conclusion, according to the method for fabricating a spherical concave mirror in an optical waveguide based on UV grayscale lithography in the above examples of the present invention, a key component is the specially designed mask pattern composed of the rectangle as well as the semicircle adjacent to the rectangle, where the rectangular area has no grayscale distribution, and the UV light penetrating through different portions of the rectangular area has the same intensity; the semicircular area has the grayscale distribution, and the UV light penetrating through the semicircular area with the grayscale distribution is changed in intensity from the center of the circle in the radius direction according to a special function distribution law; the interlayer photoresist in the rectangular area is irradiated by the UV light penetrating through the mask plate and is developed to form the optical waveguide core; the upper portion of the interlayer photoresist in the partial semicircular area is fully irradiated according to the grayscale distribution law of the intensity of the UV light; after being developed, the positive interlayer photoresist is gradually increased in thickness from the center of the circle in the radial direction, the negative interlayer photoresist is gradually decreased in thickness from the center of the circle in the radial direction, so that the spherical concave surface or convex surface is integrally formed on the optical waveguide; the spherical concave surface or convex surface is coated with the metal film or the dielectric high-reflective film to form the spherical concave mirror. The present invention has easy operation, desirable controllability, and compatibility with the process for fabricating the optical waveguide.

The above examples, explained with reference to the accompanying drawings, of the present invention are not intended to limit the present invention and can be variously changed based on the objective of the present invention. Any changes, modifications, substitutes, combinations, or simplifications made according to the spirit and principle of the technical solution of the present invention are regarded as equivalent alternatives and should fall within the protection scope of the present invention without deviating from the technical principle and concept of the method for fabricating a spherical concave mirror in an optical waveguide based on UV grayscale lithography of the present invention as long as conforming to the objective of the present invention.

What is claimed is:

1. A method for fabricating a spherical concave mirror in an optical waveguide based on ultraviolet (UV) grayscale lithography, being mainly implemented by means of UV exposure through a lithography machine capable of generating a mask pattern; wherein the mask pattern comprises a semicircular mask with a grayscale distribution, the grayscale distribution refers to that gray values of images are changed in a stepped manner in a radial direction of the semicircular mask so that light penetrating through different areas of the semicircular mask has different intensities; and the lithography machine performs exposure according to the mask pattern, and the light penetrating through the semicircular mask with the grayscale distribution is changed in intensity from a center to an edge of a circle in a radial direction according to a change law of a decreasing function; in a process for fabricating an optical waveguide by means of UV lithography, an interlayer photoresist in the semicircular mask is irradiated by the light having the intensity changed according to the grayscale distribution and is then developed to obtain a spherical concave surface or convex surface; and afterwards, the obtained spherical concave surface or convex surface is coated with a metal film or a dielectric high-reflective film and finally spin-coated with a cladding photoresist, in this way, a spherical concave mirror is fabricated on the optical waveguide.

2. The method for fabricating a spherical concave mirror in an optical waveguide based on UV grayscale lithography according to claim 1, wherein the mask pattern comprises a rectangle and a semicircle adjacent to the rectangle; a rectangular area of a mask has no grayscale distribution, in this case, UV light penetrating through all areas of the mask has a same intensity; and a semicircular area having a radius longer than a width of the rectangular area has the grayscale distribution, and the UV light penetrating through the mask is regulated in intensity in a radius direction of the semicircular area according to the change law of the decreasing function.

3. The method for fabricating a spherical concave mirror in an optical waveguide based on UV grayscale lithography according to claim 2, wherein the rectangular area of the mask is completely opaque or completely transparent.

4. The method for fabricating a spherical concave mirror in an optical waveguide based on UV grayscale lithography according to claim 2, wherein if a spherical concave structure is fabricated on the optical waveguide by means of a positive interlayer photoresist, when the mask is exposed under the UV light, the interlayer photoresist in the rectangular area is fully irradiated; after being developed, the interlayer photoresist irradiated by the UV light is removed, and the interlayer photoresist unirradiated by the UV light is retained, so that an optical waveguide core is formed; and the interlayer photoresist in a partial semicircular area has an upper half fully irradiated according to a grayscale distribution law of the intensity of the UV light and changed in thickness from the center to the edge of the circle in the radius direction of the semicircular area according to a change law of an increasing function as well as an incompletely irradiated lower half retained after being developed, so that the concave surface is formed on a corresponding interlayer in the semicircular area of the mask; and afterwards, the obtained spherical concave surface is coated with the metal film or the dielectric high-reflective film and then spin-coated with the cladding photoresist, in this way, the spherical concave mirror is fabricated on the optical waveguide.

5. The method for fabricating a spherical concave mirror in an optical waveguide based on UV grayscale lithography according to claim 2, wherein if the spherical concave structure is fabricated on the optical waveguide by means of a negative interlayer photoresist, when the mask is exposed under the UV light, the negative interlayer photoresist in the rectangular area is fully irradiated; after being developed, the negative interlayer photoresist unirradiated by the UV light is removed, the negative interlayer photoresist irradiated by the UV light is retained, so that an optical waveguide core is formed; and an upper half of the negative interlayer photoresist in a partial semicircular area is fully irradiated according to a grayscale distribution law of the intensity of the UV light and is changed in thickness in the radius direction of the semicircular area according to the change law of the decreasing function, and only the fully irradiated upper half of the negative interlayer photoresist is retained after being developed, so that a convex surface is formed on a corresponding interlayer in the semicircular area of the mask, and a concave surface is formed opposite the convex surface in the interlayer; and afterwards, the obtained spherical concave surface is coated with the metal film or the dielectric high-reflective film and then spin-coated with the cladding photoresist, in this way, the spherical concave mirror is fabricated on the optical waveguide.

6. The method for fabricating a spherical concave mirror in an optical waveguide based on UV grayscale lithography according to claim 1, wherein a grayscale distribution function of a corresponding light intensity in a semicircular area of a mask is controlled as follows:

at a same lithographic period, an intensity of UV light, which is required by lithography at all points, is determined by lithographic depths at all the points on the obtained spherical concave surface to determine the grayscale distribution function of the light intensity in the semicircular area of the mask; and due to circular symmetry of the spherical concave surface, the grayscale distribution function of the light intensity in the semicircular area of the mask has a rule that gray values are gradually changed from the center to the edge of the circle in the radius direction.

\* \* \* \* \*